United States Patent [19]

Shpiro

[11] Patent Number: 4,860,313

[45] Date of Patent: Aug. 22, 1989

[54] ADAPTIVE DIFFERENTIAL PULSE CODE MODULATION (ADPCM) SYSTEMS

[75] Inventor: Zeev Shpiro, Tel Aviv, Israel

[73] Assignee: ECI Telecom Ltd., Tel Aviv, Israel

[21] Appl. No.: 99,068

[22] Filed: Sep. 21, 1987

[30] Foreign Application Priority Data

Sep. 21, 1986 [IL] Israel .................................. 80103

[51] Int. Cl.$^4$ ............................................. H04B 1/66
[52] U.S. Cl. ...................................... 375/27; 375/122;
 341/61; 358/136
[58] Field of Search ........................ 375/27, 122, 30;
 358/133, 135, 136, 138; 340/347 AD, 347 DD;
 341/61

[56] References Cited

U.S. PATENT DOCUMENTS

| | | | |
|---|---|---|---|
| 4,319,082 | 3/1982 | Gilloire et al. ........................ | 375/27 |
| 4,354,273 | 10/1982 | Araseki et al. | |
| 4,437,087 | 3/1984 | Petr ...................................... | 375/27 |
| 4,475,213 | 10/1984 | Medaugh ............................. | 375/27 |
| 4,516,241 | 5/1985 | Farah et al. ........................... | 375/30 |
| 4,654,863 | 3/1987 | Belfield et al. ....................... | 375/27 |
| 4,700,226 | 10/1987 | Acampora ............................ | 375/27 |

OTHER PUBLICATIONS

Recommendation G.721 of the International Telegraph and Telephone Consultative Committee (CCITT), appearing in vol. III.3 of the Redbook issued at the Malaga-Torremoitnos Plenary Assembly of 19 Oct. 1984, Appendix I.

Report of Study Group VXIII of the CCITT, Apr. 87, Jul. 87.

*Primary Examiner*—Robert L. Griffin
*Assistant Examiner*—Marianne Huseman
*Attorney, Agent, or Firm*—Michael N. Meller

[57] ABSTRACT

Apparatus and technique for ADPCM transmission of voiceband data at rates up to and including 9600 bits/s via an ADPCM system comprising an ADPCM transmitter receiving PCM encoded signals at an 8 KHz sampling rate and being operative to transmit data at a sampling rate of 6.4 KHz and a transmission rate of 5 bits per sample and an ADPCM receiver having apparatus for receiving the transmitted data from the ADPCM transmitter and being operative for providing PCM encoded signals at an 8 KHz sampling rate. The ADPCM transmitter includes an adaptive quantizer which is operative to provide an output signal I(n), employing a scale factor adapted according to a discrete function difference signal W(I) having a relationship to I(n) which typically is substantially different from that given in recommendation G.721 of the CCITT. The ADPCM transmitter also includes an adaptive predictor having predictor coefficients which are updated using a leak factor lower than that shown in recommendation G.721 of the CCITT.

16 Claims, 2 Drawing Sheets

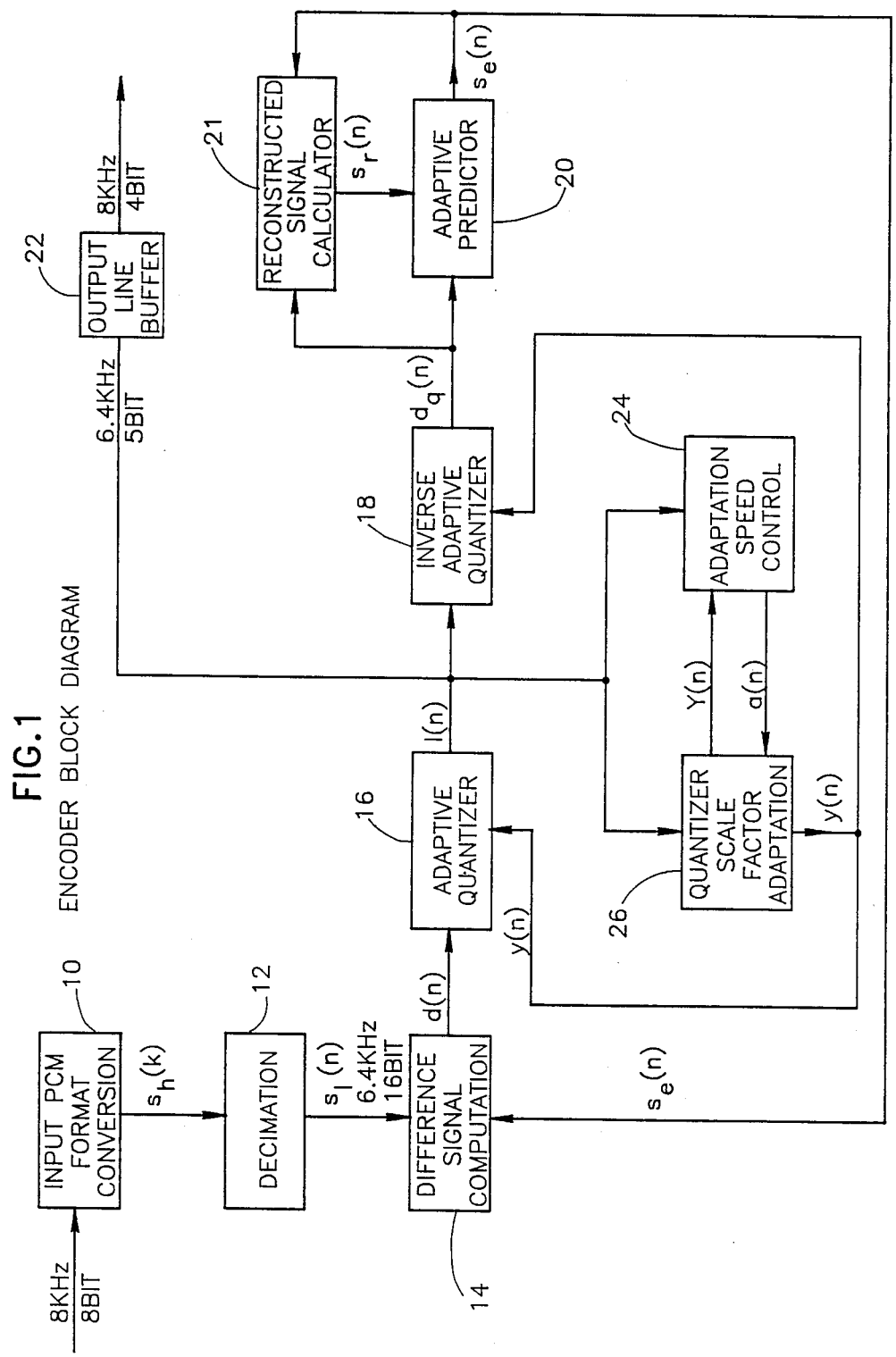
FIG.1 ENCODER BLOCK DIAGRAM

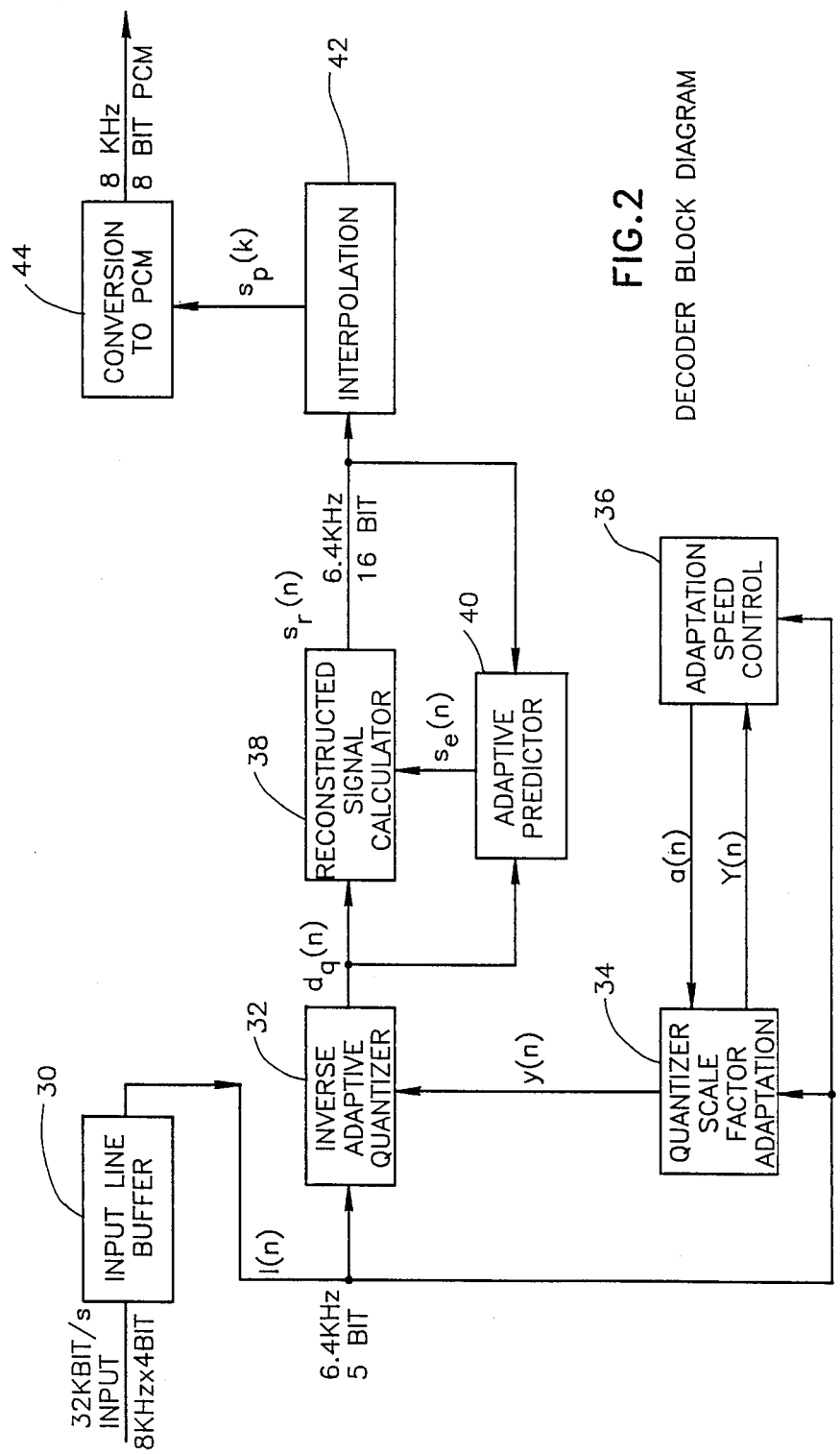
FIG.2 DECODER BLOCK DIAGRAM

ADAPTIVE DIFFERENTIAL PULSE CODE MODULATION (ADPCM) SYSTEMS

FIELD OF THE INVENTION

The present invention relates to telecommunications apparatus and techniques generally and more particularly to adaptive differential pulse code modulation (ADPCM) systems providing bit rate compression of voiceband data signals.

BACKGROUND OF THE INVENTION

Various types of ADPCM speech compression systems are in use today throughout the world. The relevant recommendation G. 721 of the International Telegraph and Telephone Consultative Committee (CCITT) appearing in Volume III, Fascicle III.3 of the Red Book issued at the Malaga-Torremolinos Plenary Assemby of 19 Oct. 1984 indicates at Appendix I that the ADPCM systems which meet the present CCITT standard do not provide satisfactory voiceband data transmission at 9600 bit/s.

In Report R 17 of Study Group XVIII-of the CCITT dated April, 1986, four general directions were proposed for enabling ADPCM apparatus to provide satisfactory voiceband data transmission at 9600 bit/s:

A. Provision of a new ADPCM algorithm at 32 Kbit/second without voiceband data discrimination;

B. Use of 40 Kbit/s ADPCM based on Recommendation G.721 with a data rate analyzer for voiceband data discrimination;

C. Use of a data-optimized ADPCM algorithm at 32 Kbit/s and detecting the V. 29 training signal to provide voiceband data discrimination; and D. Use of a data optimized algorithm at 32 Kbit/s and detecting the header tone to provide voiceband data discrimination.

Proposal D was originated by the present applicant, but the technique and apparatus for carrying it out was not disclosed.

SUMMARY OF THE INVENTION

The present invention seeks to provide apparatus and a technique for ADPCM transmission of voiceband data at rates up to and including 9600 bit/s.

There is thus provided in accordance with a preferred embodiment of the present invention an ADPCM system comprising an ADPCM transmitter receiving PCM encoded signals at an 8 KHz sampling rate and being operative to transmit data at a sampling rate of 6.4 KHz and a transmission rate of 5 bits per sample and an ADPCM receiver having apparatus for receiving the transmitted data from the ADPCM transmitter and being operative for providing PCM encoded signals at an 8 KHz sampling rate.

Conventional ADPCM apparatus transmits with a sampling rate of 8 KHz, 4 bits per sample. The present invention achieves enhanced precision for the ADPCM process by operating at 5 bits per sample. Due to the reduction of the sampling rate to 6.4 KHz, however, the overall line bit rate between the transmitter and receiver is maintained at 32 Kbit/s, as in standard ADPCM systems. Accordingly the invention can be utilized in a 32 Kbit/s conventional ADPCM environment and voice and voiceband data transmissions can be selectably transmitted through the standard ADPCM and through the voiceband data ADPCM circuitry of the invention respectively with ease.

Additionally in accordance with a preferred embodiment of the invention, the ADPCM transmitter includes an adaptive quantizer which is operative to provide an output signal I(n), employing a scale factor adapted according to a discrete function difference signal W(I) having a relationship to I(n) which typically is substantially different from that given in recommendation G.721 of the CCITT.

The values of W(I) in the G.721 recommendation of the CCITT were determined to correspond to characteristics of voice transmission and voiceband data transmissions at rates lower than 9600 bit/s. Applicants have found that in 9600 bit/s voiceband data transmissions the variance of the difference signal d(n) input to the adaptive quantizer is substantially greater than for lower rate voiceband data and voice transmissions.

Accordingly, applicants have determined that in order to achieve acceptable quality transmission of voiceband data at 9600 bit/s, W(I) values must have a relationship to I(n) which is established by an empirical method in which an optimal scale factor is first obtained by experimentation to find the scale factor of a fixed quantizer which maximizes performance under the worst case V.29 modem condition. Then the values of W(I) for the adaptive quantizer are adjusted to provide convergence with the optimal scale factor. Applicants have also found that this modification does not have deleterious effects on the transmission of voice or lower rate voiceband data.

Further in accordance with a preferred embodiment of the invention, the ADPCM transmitter comprises an encoder including an input PCM format conversion circuit receiving 8 KHz, 8 Bit sample signals and converting them to a uniform PCM signal, decimation circuitry converting the output of the format conversion circuitry to a PCM signal having a sampling rate of 6.4 KHz, difference signal computation circuitry operative to calculate the difference between the output of the decimation circuitry and an estimated signal, an adaptive quantizer, responsive to a quantizer control signal to convert the difference signal to a 5 bit quantized output, an inverse adaptive quantizer receiving the quantized output of the adaptive quantizer and responsive to the quantizer control signal to provide a quantizer scale factor, quantizer scale factor adaptation circuitry receiving the quantized output of the adaptive quantizer and providing the quantizer control signal, an adaptive predictor, receiving the output of the inverse adaptive quantizer and providing the estimated signal, and an output line buffer receiving the output of the adaptive quantizer and converting the 6.4 KHz 5 bit signal to an 8 KHz 4 bit signal.

Further in accordance with an embodiment of the invention there is provided an ADPCM system comprising an ADPCM transmitter receiving PCM encoded signals at 64 Kbit/s and being operative to transmit data at a lower rate and an ADPCM receiver having apparatus for receiving the transmitted data from the ADPCM transmitter and being operative for providing PCM encoded signals at 64 Kbit/s, wherein said ADPCM transmitter includes an adaptive quantizer which is operative to provide an output signal I(n), employing a scale factor adapted according to a discrete function difference signal W(I) having a relationship to I(n) which typically is substantially different from that given in recommendation G.721 of the CCITT.

Additionally in accordance with a preferred embodiment of the invention, the ADPCM receiver comprises a decoder comprising an input line buffer receiving a 32 kbit/second signal input and converting it to a 6.4 KHz 5 bit signal, an inverse adaptive quantizer receiving the output of the input line buffer and responsive to a second quantizer control signal to provide a quantizer scale factor, an adaptive predictor and reconstructed signal calculator receiving the output of the inverse adaptive quantizer and providing a 6.4 KHz, 16 bit output, quantizer scale factor adaptation circuitry receiving the quantized output of the adaptive quantizer and providing the quantizer control signal, an adaptive predictor, receiving the output of the inverse adaptive quantizer and providing the estimated signal; interpolation circuitry, receiving the output of the adapative predictor and reconstructed signal calculator and being operative to convert the PCM signals at 6.4 KHz to signals sampled at 8 KHz, and conversion circuitry, operative to receive the reconstructed PCM signal output of the interpolation circuitry into a PCM signal of required format.

Additionally in accordance with an embodiment of the invention, the decimation circuitry comprises a FIR linear phase filter.

Further in accordance with an embodiment of the invention, the interpolation circuitry comprises a FIR linear phase filter.

Additionally in accordance with the invention, there is provided an ADPCM communications system including in addition to the apparatus described above apparatus for sensing a header signal indicating the presence of a voiceband data signal and apparatus for routing the voiceband signal to the ADPCM encoder and decoder apparatus in response to a sensed header signal.

The present invention achieves transparency of voiceband data transmission at rates up to and including 9600 bit/s without requiring complex techniques such as frequency shift or voiceband data rate detection and without increasing the line data rate between the transmitter and the receiver.

BRIEF DESCRIPTION OF THE DRAWINGS

The present invention will be more fully understood and appreciated from the following detailed description, taken in conjunction with the drawings, in which:

FIG. 1 is a block diagram illustration of an ADPCM encoder constructed and operative in accordance with a preferred embodiment of the present invention; and FIG. 2 is a block diagram illustration of an ADPCM decoder constructed and operative in accordance with a preferred embodiment of the present invention.

DETAILED DESCRIPTION OF A PREFERRED EMBODIMENT

Reference is now made to FIGS. 1 and 2, which show a typical implementation of the ADPCM circuitry of the present invention, which provides transmission of voiceband data (VBD) signals, including 9.6 Kbit/s modem signals, via a 32 Kbit/s channel.

Generally speaking, the apparatus and technique of the present invention enables transmission of VBD signals at rates up to 4.8 Kbit/s at the same quality (or better) as the new ADPCM algorithm described in CCITT Recommendation G.721. In addition, the apparatus of the present invention overcomes the limitation of the G.721 ADPCM which is unable to transmit reliably voiceband data at rates higher than 4.8 Kbit/s. This apparatus also provides a solution to existing difficulties with Bell 202 and V.23 modems.

According to the present invention the following conversion is provided for the transmission of a 64 Kbit/s A-Law/Mu-Law VBD channel to and from a 32 Kbit/s channel. The conversion is applied to the PCM bit stream using a Voiceband Data Optimized Algorithm (VDOA) transcoding technique. The relationship between the voice frequency signals and the PCM encoding/decoding laws is fully specified in CCITT Recommendation G.711.

Reference is now made to FIG. 1, which illustrates a voiceband data optimized algorithm encoder constructed and operative in accordance with a preferred embodiment of the invention.

An 8 KHz, 8 Bit signal is received by an input PCM format conversion circuit 10 which converts the input signal s(k) from A-law or Mu-law PCM format to a uniform PCM signal $s_1(k)$ in accordance with CCITT Recommendation G 711. Subsequent to the conversion of the A-law or Mu-Law PCM input signal to uniform PCM, a down sampling process from 8 KHz to 6.4 KHz is performed by a decimation circuit 12, typically embodied in a 100 tap linear phase FIR filter having filter coefficients given in Table I, hereinbelow. The decimation circuit 12 is operative to convert the uniform PCM signal sampled at 8 KHz, i.e. every 125 microsec to a uniform PCM signal sampled at 6.4 KHz, i.e. every 156.25 microsec.

The output of the decimation circuit 12 passes through a five bit ADPCM process optimized for voiceband data, and is fed to a line buffer which changes the structure of the output from 6.4 KHz 5 bit form into 8 KHz 4 bit form.

The ADPCM process is implemented as follows:

A difference signal is obtained by subtracting an estimate of the input signal from the input signal itself in difference signal computation circuitry 14. Then an adaptive 31-level quantizer 16 is used to assign five binary digits to the value of the difference signal transmission to the decoder (FIG. 2).

An inverse adaptive quantizer 18 produces a quantized difference signal from the same five binary digits. The signal estimate is added to this quantized difference signal in a reconstructed signal calculator 21 to produce the reconstructed version of the input signal. Both the reconstructed signal and the quantized difference signal are fed into an adaptive predictor 20 which produces the estimate of the input signal, thereby completing the feedback loop.

It is noted that in FIG. 1, k is the sampling index when samples are taken at 125 microsec intervals (8 KHz) and n is the sampling index when the intervals are 156.25 microsec (6.4 KHz).

$$d(n) = s_1(n) - s_e(n) \qquad (1)$$

The difference signal computation circuitry 14 is operative to calculate the difference signal d(n) from the uniform PCM signal $s_1(n)$ and the signal estimate $s_e(n)$:

As noted above, a 31-level non-uniform adaptive quantizer 16 is used to quantize the difference signal d(n). Prior to quantization, d(n) is converted to base 2 logarithmic representation and scaled by y(n) which is computed by the scale factor adaptation block. The normalized input/output characteristic (infinite precision values) of the quantizer is given in Table 2. Five binary digits are used to specify the quantized level representing d(n). (Four bits for the magnitude and one bit for the sign). The 5 bit quantizer output I(n) is fed to an output line buffer 22, which changes I(n) format from 6.4 KHz 5 bit to 8 KHz 4 bit. I(n) is also fed to the inverse adaptive quantizer 18, adaptation speed control circuitry 24 and quantizer scale factor adaptation circuitry 26.

The inverse adaptive quantizer 18 is operative to produce a quantized version $d_q(n)$ of the difference signal by scaling, using y(n) specific values selected from the normalized quantizing characteristic given in Table 2 and then transforming the result from the logarithmic domain.

The quantizer scale factor adaptation circuitry 26 computes y(n), the scaling factor for the quantizer and the inverse quantizer. The input is the 5 bit quantizer output I(n). The scale factor y(n) is recursively computed in the base 2 logarithmic domain according to:

$$y(n) = [1 - a(n)]y(n-1) + a(n)W[I(n)] \quad (2)$$
Where a(n) is limited by $2^{-9} \leq a(n) \leq 2^{-6}$
and y(n) by $1.06 \leq y(n) \leq 10.00$
The discrete function W(I) is defined as follows:

| |I(n)| | 15 | 14 | 13 | 12 | 11 | 10 |
|---|---|---|---|---|---|---|
| W(I) | 245.94 | 136.88 | 76.98 | 55.54 | 41.73 | 28.61 |
| |I(n)| | 9 | 8 | 7 | 6 | 5 | 4 |
| W(I) | 22.31 | 15.14 | 11.55 | 8.65 | 5.71 | 2.58 |
| |I(n)| | 3 | 2 | 1 | 0 | | |
| W(I) | 1.28 | 0.04 | −1.59 | −2.40 | | |

The factor [1 − a(n)] introduces finite memory into the adaptive proccess so the states of the encoder and decoder converge after the occurrence of transmission errors.

Adaptation Speed Control

The controlling parameter a(n) can assume values in the range $[2^{-9}, 2^{-6}]$. It gets the lower value for voice band data signals and tones, and the higher value for silence periods. The mechanism for changing a(n) is:

*The initial value for a(n) is $2^{-6}$ - high speed mode.

**When an energy step is observed, (by 3 consecutive samples with y(n) > 3.5), a(n) is self-decayed to $2^{-9}$ - low speed mode, according to:
$$a(n) = (1 - 2^{-3})[a(n-1)] \quad (3)$$

***When an energy drop is observed, a(n) is changed back to $2^{-6}$ - the high speed mode.

The primary function of the adaptive predictor 20 is to compute the signal estimate $s_e(n)$ from the quantized difference signal $d_q(n)$. Two adaptive predictor structures are used, a sixth order section that models zeroes and a second order section that models poles in the input signal. The signal estimate is given by, $$s_e(n) = \sum_{i=1}^{2} a_i(n-1)s_r(n-i) + s_{ez}(n), \quad (4)$$

$$\text{Where } s_{ez}(n) = \sum_{i=1}^{6} b_i(n-1)d_q(n-i), \quad (5)$$

and the reconstructed signal is defined as $$s_r(n-i) = s_e(n-i) + d_q(n-i) \quad (6)$$

Both sets of predictor coefficients are updated using a simplified gradient algorithm: for the second order predictor- $$a_1(n) = (1-2^{-11})[a_1(n-1)] + 2^{-9} \text{ sgn }[d_q(n)] \text{ sgn }[s_r(n-1)] \quad (7)$$

$$a_2(n) = (1-2^{-10})[a_2(n-1)] + 2^{-9} \text{ sgn }[d_q(n)] \text{ sgn }[s_r(n-2)] \quad (8)$$

Where sgn [0] = 1; With the stability constraints:

$$|a_2(n)| \leq 0.75 \text{ and } |a_1(n)| \leq 1 - 2^{-4} - a_2(n)$$

for the sixth order predictor- $$b_i(n) = (1 - 2^{-10})[b_i(n-1)] + 2^{-9} sgn[d_q(n)]sgn[d_q(n-i)] \quad (9)$$

for $i = 1, 2, \ldots, 6$

As above, sgn [0] = 1. However sgn $[d_q(k-i)]$ is defined to be 0 when $d_q(k-i) = 0$ and i = 0. Note that $b_i(k)$ is implicitly limited to ±2.

Equations 7, 8 and 9 include a leak factor which is identified in the G.721 recommendation as the subtrahend in the coefficient of the poles or zeroes $a_i(n-1)$ or $b_i(n-1)$. The leak factor shown in these equations is lower than that shown in the recommendation. This decrease in the leak factor results in an improved transmission quality of high speed voiceband data.

The output line buffer 22 is operative to accept as an input, groups of 5 bits at an average rate of 6.4 KHz, lump them into quadruplets and output them to the line at the rate of 8 KHz.

Reference is now made to FIG. 2 which illustrates an ADPCM decoder including an input line buffer 30 which receives an 8 KHz 4 Bit input signal and provides a 6.4 KHz 5 bit signal I(n). The signal I(n) is supplied to an inverse adaptive quantizer 32, to a quantizer scale factor adaptation circuit 34 and to an adaptation speed control circuit 36, which are of substantially identical structure and function as corresponding circuits 18, 26 and 24, described above in connection with the description of FIG. 1.

The output of the inverse adaptive quantizer, designated $d_q(n)$ is supplied to reconstructed signal calculation circuitry 38 and to an adaptive predictor 40, which also supplies an input, designated $s_e(n)$ to the reconstructed signal calculation circuitry 38. Circuitry 38 and predictor 40 are similar in structure and operation to corresponding circuits 21 and 20 described hereinabove in connection with FIG. 1.

The output of reconstructed signal calculation circuitry, designated $s_r(n)$ is a 6.4 KHz 16 Bit signal and is supplied to interpolation circuitry 42, typically embodied in a 99 tap FIR linear phase filter whose coefficients are given in Table 3. The interpolation circuitry converts a uniform PCM signal sample at 6.4 KHz at an 8 KHz rate into 5 bit groups and outputs them at an average rate of 6.4 KHz.

The output of interpolation circuitry 44 is supplied as a signal designated $s_p(n)$ to a conversion circuit 44, which converts the reconstructed uniform PCM signal into an A-law or Mu-law PCM signal as required in accordance with CCITT recommendation G. 711.

It will be appreciated by persons skilled in the art that the present invention is not limited by what has been particularly shown and described hereinabove. Rather the scope of the present invention is defined only by the claims which follow:

TABLE 1

| | |
|---|---|
| h(0) = | −1.22519 E-04 |
| h(1) = | 1.40897 E-03 |
| h(2) = | 1.83778 E-03 |
| h(3) = | 2.38912 E-03 |
| h(4) = | 2.69542 E-03 |
| h(5) = | 2.32786 E-03 |
| h(6) = | 1.40897 E-03 |
| h(7) = | 0. |

TABLE 1-continued

| | |
|---|---|
| h(8)= | −1.47023 E-03 |
| h(9)= | −2.63416 E-03 |
| h(10)= | −2.94046 E-03 |
| h(11)= | −2.20534 E-03 |
| h(12)= | −5.51335 E-04 |
| h(13)= | 1.59275 E-03 |
| h(14)= | 3.49179 E-03 |
| h(15)= | 4.41068 E-03 |
| h(16)= | 3.85935 E-03 |
| h(17)= | 1.83778 E-03 |
| h(18)= | −1.22519 E-03 |
| h(19)= | −4.28816 E-03 |
| h(20)= | −6.30973 E-03 |
| h(21)= | −6.24847 E-03 |
| h(22)= | −3.92061 E-03 |
| h(23)= | 1.83778 E-04 |
| h(24)= | 4.90076 E-03 |
| h(25)= | 8.51507 E-03 |
| h(26)= | 9.55648 E-03 |
| h(27)= | 7.22862 E-03 |
| h(28)= | 1.83778 E-03 |
| h(29)= | −5.02328 E-03 |
| h(30)= | −1.11492 E-02 |
| h(31)= | −1.40897 E-02 |
| h(32)= | −1.23132 E-02 |
| h(33)= | −5.63587 E-03 |
| h(34)= | 4.28816 E-03 |
| h(35)= | 1.44572 E-02 |
| h(36)= | 2.10733 E-02 |
| h(37)= | 2.10120 E-02 |
| h(38)= | 1.30483 E-02 |
| h(39)= | −1.71527 E-03 |
| h(40)= | −1.93580 E-02 |
| h(41)= | −3.41215 E-02 |
| h(42)= | −3.97574 E-02 |
| h(43)= | −3.12423 E-02 |
| h(44)= | −6.67728 E-03 |
| h(45)= | 3.20387 E-02 |
| h(46)= | 7.93923 E-02 |
| h(47)= | 0.126807 |
| h(48)= | 0.165156 |
| h(49)= | 0.186535 |

TABLE 3-continued

| | |
|---|---|
| f(7)= | −4.53320 E-04 |
| f(8)= | −1.21294 E-03 |
| f(9)= | −1.31095 E-03 |
| f(10)= | −5.51335 E-04 |
| f(11)= | 9.80152 E-04 |
| f(12)= | 2.90370 E-03 |
| f(13)= | 4.59446 E-03 |
| f(14)= | 5.42759 E-03 |
| f(15)= | 4.97427 E-03 |
| f(16)= | 3.19775 E-03 |
| f(17)= | 5.63587 E-04 |
| f(18)= | −2.07057 E-03 |
| f(19)= | −3.73683 E-03 |
| f(20)= | −3.60206 E-03 |
| f(21)= | −1.39672 E-03 |
| f(22)= | 2.43813 E-03 |
| f(23)= | 6.84881 E-03 |
| f(24)= | 1.03651 E-02 |
| f(25)= | 1.15903 E-02 |
| f(26)= | 9.77702 E-03 |
| f(27)= | 5.10904 E-03 |
| f(28)= | −1.15168 E-03 |
| f(29)= | −6.99583 E-03 |
| f(30)= | −1.02303 E-02 |
| f(31)= | −9.23793 E-03 |
| f(32)= | −3.60206 E-03 |
| f(33)= | 5.47660 E-03 |
| f(34)= | 1.54129 E-02 |
| f(35)= | 2.28498 E-02 |
| f(36)= | 2.46631 E-02 |
| f(37)= | 1.91007 E-02 |
| f(38)= | 6.61603 E-03 |
| f(39)= | −9.88728 E-03 |
| f(40)= | −2.55085 E-02 |
| f(41)= | −3.44401 E-02 |
| f(42)= | −3.14874 E-02 |
| f(43)= | −1.36854 E-02 |
| f(44)= | 1.86474 E-02 |
| f(45)= | 6.16271 E-02 |
| f(46)= | 0.108319 |
| f(47)= | 0.150233 |
| f(48)= | 0.179294 |
| f(49)= | 0.189684 |

TABLE 2

Quantizer normalized input/output characteristic

| NORMALIZED QUANTIZER INPUT RANGE | I(n) | | NORMALIZED QUANTIZER OUTPUT |
|---|---|---|---|
| $\log_2 \|d(n)\| - y(n)$ | $d(n) \geq 0$ | $d(n) < 0$ | $\log_2 \|d_q(n)\| - y(n)$ |
| [3.46, +∞) | 15 | 16 | 3.59 |
| [3.20, 3.46) | 14 | 17 | 3.31 |
| [2.99, 3.20) | 13 | 18 | 3.09 |
| [2.80, 2.99) | 12 | 19 | 2.89 |
| [2.61, 2.80) | 11 | 20 | 2.71 |
| [2.42, 2.61) | 10 | 21 | 2.52 |
| [2.23, 2.42) | 9 | 22 | 2.33 |
| [2.02, 2.23) | 8 | 23 | 2.12 |
| [1.79, 2.02) | 7 | 24 | 1.90 |
| [1.52, 1.79) | 6 | 25 | 1.66 |
| [1.22, 1.52) | 5 | 26 | 1.38 |
| [0.84, 1.22) | 4 | 27 | 1.04 |
| [0.35, 0.84) | 3 | 28 | 0.61 |
| [−0.40, 0.35) | 2 | 29 | 0.00 |
| [−1.98, −0.40) | 1 | 30 | −0.98 |
| [−∞, −1.98) | 31 | 31 | −∞* |
| | 0 | 0 | −∞** |

*For a 31 level quantizer, the first positive and negative regions around zero have the same code word (31) and the same output level (zero).
**It is possible for the decoder to receive code word 00000 because of transmission disturbances (e.q. line bit errors).

TABLE 3

| | |
|---|---|
| f(0)= | −1.18843 E-03 |
| f(1)= | 1.82553 E-03 |
| f(2)= | 1.93580 E-03 |
| f(3)= | 2.14408 E-03 |
| f(4)= | 2.05832 E-03 |
| f(5)= | 1.50698 E-03 |
| f(6)= | 5.75839 E-04 |

We claim:
1. An ADPCM system comprising:
at a first end of a transmission line:
ADPCM transmitter means for receiving PCM encoded signals at an 8 KHz sampling rate and being operative to output data at a sampling rate of 6.4 KHz at 5 bits per sample;

output line buffer meamns for receiving the output of said ADPCM transmitter means and providing an identical information output having a converted format of a sampling rate of 8 KHz at 4 bits per sample;

at a second end of said transmission line:

input line buffer means for receiving a signal along said transmission line having a sampling rate of 8 KHz at 4 bits per sample and providing an identical information output having a converted format of a sampling rate of 6.4 KHz at 5 bits per sample; and ADPCM receiver means for receiving the transmitted data from the input line buffer means and being operative for providing PCM encoded signals at an 8 KHz sampling rate.

2. Appratus according to claim 1 and wherein said ADPCM transmitter means includes an adaptive quantizer which is operative to provide an output signal $I(n)$, employing a scale factor adapted according to a discrete function difference signal $W(I)$ having a relationship to $I(n)$ which is established by an empirical method, the values of $W(I)$ being determined to correspond to characteristics of voice transmission and voiceband data transmissions at rates up to and including 9600 bits/second.

3. The apparatus according to claim 1, wherein the apparatus further comprising means for sensing a header signal indicating the presence of a voiceband date signal and means for routing the voice band signal to said ADPCM transmitter means and to said ADPCM receiver means in response to said sensed header signal.

4. Apparatus according to claim 1 and wherein said ADPCM transmitter comprises:
an encoder including an input PCM format conversion circuit receiving 8 KHz, 8 Bit sampling signals and converting them to a uniform PCM signal;
decimation circuitry converting the output of the format conversion circuitry to a PCM signal having a sampling rate of 6.4 KHz;
difference signal comutation circuitry operative to calculate the difference between the output of the decimation circuitry and an estimated signal;
an adaptive quantizer, responsive to a quantizer control signal to convert the difference signal to a 5 bit quantized output;
an inverse adaptive quantizer receiving the quantized output of the adaptive quantizer and responsive to the quantizer control signal to provide a quantizer scale factor;
quantizer scale factor adaptation circuitry receiving the quantized output of the adaptive quantizer and providing the quantizer control signal;
an adaptive predictor, receiving the output of the inverse adaptive quantizer and providing the estimated signal; and
an output line buffer receiving the output of the adaptive quantizer and converting the 6.4 KHz 5 bit signal to an 8 KHz 4 bit signal.

5. Apparatus according to claim 4 and wherein said ADPCM transmitter means includes an adaptive quantizer which is operative to provide an output signal $I(n)$, employing a scale factor adapted according to a discrete function difference signal $W(I)$ having a relationship to $I(n)$ which is established by an empirical method, the values of $W(I)$ being determined to correspond to characteristics of voice transmission and voiceband data transmissions at rates up to and including 9600 bits/second.

6. Apparatus according to claim 4 and wherein said decimation circuitry comprises a FIR linear phase filter.

7. The Apparatus according to claim 1, wherein said ADPCM transmitter means and said ADPCM receiver means comprise an adaptive quantizer including means for providing scale factor adaptation which is optimized for voiceband data transmission at 9600 bits per second.

8. An ADPCM system comprising:
at a first end of a transmission line:
ADPCM transmitter means for receiving PCM encoded signals at 64 Kbit/s and being operative to transmit data at a lower rate;
output line duffer means for receiving the output of said ADPCM transmitter means and providing an identical information output having a converted format of a sampling rate of 8 KHz at 4 bits per sample; and
at a second end of said transmission line:
input line buffer means for receiving a signal along said transmission line having a sampling rate of 8 KHz at 4 bits per sample and providing an identical information output having a converted format of a sampling rate of 6.4 KHz at 5 bits per sample; and
ADPCM receiver means for receiving the transmitted data from the input line buffer means and being operative for providing PCM encoded signals at 64 Kbit/s, and
wherein said ADPCM transmitter means includes an adaptive quantizer which is operative to provide an output signal $I(n)$, employing a scale factor adapted according to a discrete function difference signal $W(I)$ having a relationship to $I(n)$ which is established by an empirical method, the values of $W(I)$ being determined to correspond to characteristics of voice transmission and voiceband data transmissions at rates up to and including 9600 bits/second.

9. The apparatus according to claim 8, wherein said apparatus comprising means for sensing a header signal indicating the presence of a voiceband data signal and means for routing the voiceband signal to said ADPCM transmitter means in response to said sensed header signal.

10. Apparatus according to claim 8 and wherein the ADPCM receiver comprises a decoder comprising:
an input line buffer receiving a 32 kbit/second signal input and converting it to a 6.4 KHz 5 bit signal;
an inverse adaptive quantizer receiving the output of the input line buffer and responsive to a second quantizer control signal to provide a quantizer scale factor;
an adaptive predictor and reconstructed signal calculator receiving the output of the inverse adaptive quantizer and providing a 6.4 KHz, 16 bit output;
quantizer scale factor adaptation circuitry receiving the quantized output of the adaptive quantizer and providing the quantizer control signal;
an adaptive predictor, receiving the output of the inverse adaptive quantizer and providing the estimated signal;
interpolation circuitry, receiving the output of the adaptive predictor and reconstructed signal calculator and being operative to convert the PCM signals at 6.4 KHz to signals sampled at 8 KHz; and
conversion circuitry, operative to receive the reconstructed PCM signal output of the interpolation circuitry into a PCM signal of required format.

11. Apparatus according to claim 10 and wherein said ADPCM receiver means includes an inverse adaptive quantizer which is operative to provide an output signal I(n), employing a scale factor adapted according to a discrete function difference signal W(I) having a relationship to I(n) which is established by an empirical method, the values of W(I) being determined to correspond to characteristics of voice transmission and voiceband data transmissions at rates up to and including 9600 bits/second.

12. Apparatus according to claim 10 and wherein said interpolation circuitry comprises a FIR linear phase filter.

13. An ADPCM system comprising:
at a first end of a transmission line:
ADPCM transmitter means for receiving PCM encoded signals at 64 Kbit/s and being operative to transmit data at a lower rate;
output line buffer means for receiving the output of said ADPCM transmitter means and providing an identical information output having a converted format of a sampling rate of 8 KHz at 4 bits per sample; and
ADPCM receiver means for receiving the transmitted data from the input line buffer means and being operative for providing PCM encoded signals at 64 Kbit/s, and
wherein said ADPCM transmitter means includes an adaptive predictor having a second order section that models poles in the input signal, said second order section including predictor coefficients which are updated using a leak factor lower than $2^{-8}$.

14. Apparatus according to claim 13 and further comprising means for sensing a header signal indicating the presence of a voiceband data signal and means for routing the voiceband signal to the ADPCM encoder and decoder apparatus in response to sensed header signal.

15. An ADPCM transmitter means for receiving PCM encoded signals at 64 Kbit/s and being operative to transmit data at a lower rate;
output line buffer means for receiving the output of said ADPCM transmitter means and providing an identical information output having a converted format of a sampling rate of 8 KHz at 4 bits per sample; and
at a second end of said transmission line:
input line buffer means for receiving a signal along said transmission line having a sampling rate of 8 KHz at 4 bits per sample and providing an identical information output having a converted format of a sampling rate of 6.4 KHz at 5 bits per sample; and
ADPCM receiver means for receiving the transmitted data from the input line buffer means and being operative for providing PCM encoded signals at 64 Kbit/s, and
wherein said ADPCM transmitter means includes an adaptive predictor having a sixth order section that models zeroes in the input signal, said sixth order section including predictor coefficients which are updated using a leak factor lower than $2^{-8}$;

Applicants request that the following new claim 16 be added.

16. Apparatus according to claim 15 and further comprising means for sensing a header signal indicating the presence of a voiceband data signal and means for routing the voiceband signal to the ADPCM encoder and decoder apparatus in response to sensed header signal.

* * * * *